(12) United States Patent
Koehler et al.

(10) Patent No.: US 11,569,976 B2
(45) Date of Patent: Jan. 31, 2023

(54) SUPERCONDUCTING ISOCHRONOUS RECEIVER SYSTEM

(71) Applicants: Brian Lee Koehler, Woodinville, WA (US); Corey Arthur Kegerreis, Linthicum Heights, MD (US); Haitao O. Dai, Ellicott City, MD (US); Quentin P. Herr, Ellicott City, MD (US)

(72) Inventors: Brian Lee Koehler, Woodinville, WA (US); Corey Arthur Kegerreis, Linthicum Heights, MD (US); Haitao O. Dai, Ellicott City, MD (US); Quentin P. Herr, Ellicott City, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 69 days.

(21) Appl. No.: 17/340,814

(22) Filed: Jun. 7, 2021

(65) Prior Publication Data
US 2022/0393850 A1  Dec. 8, 2022

(51) Int. Cl.
*H04L 7/00* (2006.01)
*G06F 13/40* (2006.01)
(Continued)

(52) U.S. Cl.
CPC ........ *H04L 7/0087* (2013.01); *G06F 13/4068* (2013.01); *G06N 10/00* (2019.01); *H03K 19/195* (2013.01)

(58) Field of Classification Search
CPC ... H04L 7/0087; G06N 10/00; G06F 13/4068; H03K 19/195
See application file for complete search history.

(56) References Cited

U.S. PATENT DOCUMENTS

| 5,450,438 A | 9/1995 | Landry et al. |
| 6,420,895 B1 | 7/2002 | Herr et al. |

(Continued)

FOREIGN PATENT DOCUMENTS

| CA | 2941268 A1 | 11/2015 |
| JP | 2004180188 A | 6/2004 |

(Continued)

OTHER PUBLICATIONS

Extended European Search Report (EESR) dated Oct. 5, 2022 for corresponding EP 22167206.6.

*Primary Examiner* — Cheng Yuan Tseng
(74) *Attorney, Agent, or Firm* — Tarolli, Sundheim, Covell & Tummino LLP

(57) ABSTRACT

One example includes an isochronous receiver system. The system includes a pulse receiver configured to receive an input data signal from a transmission line and to convert the input data signal to a pulse signal. The system also includes a converter system comprising a phase converter system. The phase converter system includes a plurality of pulse converters associated with a respective plurality of sampling windows across a period of an AC clock signal. At least two of the sampling windows overlap at any given phase of the AC clock signal, such that the converter system is configured to generate an output pulse signal that is phase-aligned with at least one of a plurality of sampling phases of the AC clock signal based on associating the pulse signal with at least two of the sampling windows.

20 Claims, 6 Drawing Sheets

(51) Int. Cl.
    *G06N 10/00*        (2022.01)
    *H03K 19/195*     (2006.01)

(56)         References Cited

U.S. PATENT DOCUMENTS

| | | |
|---|---|---|
| 6,765,975 B2 | 7/2004 | Dunning et al. |
| 7,532,645 B1 | 5/2009 | Bataineh et al. |
| 9,876,505 B1 * | 1/2018 | Dai ........................ G06N 10/00 |
| 10,236,869 B2 * | 3/2019 | Herr ....................... H03K 17/92 |
| 2002/0131486 A1 | 9/2002 | Haartsen |
| 2003/0028338 A1 | 2/2003 | Hidaka |
| 2005/0036595 A1 | 2/2005 | Sidhu et al. |
| 2011/0133059 A1 | 6/2011 | Kim et al. |
| 2011/0240865 A1 | 10/2011 | Frach et al. |

FOREIGN PATENT DOCUMENTS

| | | |
|---|---|---|
| JP | 2008141503 A | 6/2008 |
| JP | 2008537430 A | 9/2008 |
| JP | 2010517371 A | 5/2010 |
| JP | 2011139407 A | 7/2011 |
| JP | 2011239120 A | 11/2011 |
| JP | 2014529216 A | 10/2014 |
| KR | 20140067032 A | 6/2014 |
| WO | 199808307 A1 | 2/1998 |

\* cited by examiner

700

702

| RQL1_0 | RQL1_45 | RQL1_90 | RQL1_135 | RQL1_180 | RQL1_225 | RQL1_270 | RQL1_315 |
|---|---|---|---|---|---|---|---|
| 0 | 0 | 0 | 0 | 0 | 0 | 1 | 1 |
| 1 | 0 | 0 | 0 | 0 | 0 | 0 | 1 |
| 1 | 1 | 0 | 0 | 0 | 0 | 0 | 0 |
| 0 | 1 | 1 | 0 | 0 | 0 | 0 | 0 |
| 0 | 0 | 1 | 1 | 0 | 0 | 0 | 0 |
| 0 | 0 | 0 | 1 | 1 | 0 | 0 | 0 |
| 0 | 0 | 0 | 0 | 1 | 1 | 0 | 0 |
| 0 | 0 | 0 | 0 | 0 | 1 | 1 | 0 |
| 1 | 0 | 0 | 0 | 0 | 0 | 1 | 1 |
| 1 | 1 | 0 | 0 | 0 | 0 | 0 | 1 |
| 1 | 1 | 1 | 0 | 0 | 0 | 0 | 0 |
| 0 | 1 | 1 | 1 | 0 | 0 | 0 | 0 |
| 0 | 0 | 1 | 1 | 1 | 0 | 0 | 0 |
| 0 | 0 | 0 | 1 | 1 | 1 | 0 | 0 |
| 0 | 0 | 0 | 0 | 1 | 1 | 1 | 0 |
| 0 | 0 | 0 | 0 | 0 | 1 | 1 | 1 |
| 1 | 0 | 0 | 0 | 0 | 1 | 1 | 1 |
| 1 | 1 | 0 | 0 | 0 | 0 | 1 | 1 |
| 1 | 1 | 1 | 0 | 0 | 0 | 0 | 1 |
| 1 | 1 | 1 | 1 | 0 | 0 | 0 | 0 |
| 0 | 1 | 1 | 1 | 1 | 0 | 0 | 0 |
| 0 | 0 | 1 | 1 | 1 | 1 | 0 | 0 |
| 0 | 0 | 0 | 1 | 1 | 1 | 1 | 0 |
| 0 | 0 | 0 | 0 | 1 | 1 | 1 | 1 |

704

| EN270° | EN270° | EN270° | EN270° |
|---|---|---|---|
| 1 | 0 | 0 | 1 |
| 1 | 0 | 0 | 1 |
| 1 | 1 | 0 | 0 |
| 1 | 1 | 0 | 0 |
| 0 | 1 | 1 | 0 |
| 0 | 1 | 1 | 0 |
| 0 | 0 | 1 | 1 |
| 0 | 0 | 1 | 1 |
| 1 | 0 | 0 | 1 |
| 1 | 0 | 0 | 1 |
| 1 | 1 | 0 | 0 |
| 1 | 1 | 0 | 0 |
| 0 | 1 | 1 | 0 |
| 0 | 1 | 1 | 0 |
| 0 | 0 | 1 | 1 |
| 0 | 0 | 1 | 1 |
| 1 | 0 | 0 | 1 |
| 1 | 0 | 0 | 1 |
| 1 | 1 | 0 | 0 |
| 1 | 1 | 0 | 0 |
| 0 | 1 | 1 | 0 |
| 0 | 1 | 1 | 0 |
| 0 | 0 | 1 | 1 |
| 0 | 0 | 1 | 1 |

FIG. 7

SUPERCONDUCTING ISOCHRONOUS RECEIVER SYSTEM

TECHNICAL FIELD

This disclosure relates generally to superconducting computer systems, and more specifically to a superconducting isochronous receiver system.

BACKGROUND

Computer systems typically implement communication between separate chips, separate printed circuit boards, and/or separate computer systems. To properly implement inter-chip or other types of communication (e.g., across a bus), a clock signal can be used to properly time the transmitter and the receiver to appropriately sample the data being transmitted, such that the receiver can properly receive and process the data. However, because the clock signal can be generated from multiple sources, or can be transmitted across the inter-chip communication system, the clock signals that are implemented for transmission and for reception of the data can have an unknown or arbitrary phase relation, which can be referred to as isochronous communication. Certain types of communication, such as certain types of superconducting logic (e.g., reciprocal quantum logic, or RQL) implement the clock signal as a power source, thus precluding the possibility of clock recovery with the associated AC clock signal.

SUMMARY

One example includes an isochronous receiver system. The system includes a pulse receiver configured to receive an input data signal from a transmission line and to convert the input data signal to a pulse signal. The system also includes a converter system comprising a phase converter system. The phase converter system includes a plurality of pulse converters associated with a respective plurality of sampling windows across a period of an AC clock signal. At least two of the sampling windows overlap at any given phase of the AC clock signal, such that the converter system is configured to generate an output pulse signal that is phase-aligned with at least one of a plurality of sampling phases of the AC clock signal based on associating the pulse signal with at least two of the sampling windows.

Another example includes a method for isochronously receiving a data signal from a transmission line. The method includes providing a DC current to a pulse receiver of a receiver system to convert the data signal to a pulse signal and splitting the pulse signal into a plurality of pulse signals. The method also includes providing an AC clock signal to a phase converter system of the receiver system to convert the plurality of pulse signals into a plurality of phase-aligned signals that are associated with a respective plurality of sampling phases of the AC clock signal via a plurality of pulse converters associated with a respective plurality of sampling windows across a period of the AC clock signal. At least two of the sampling windows overlap at any given phase of the AC clock signal. The method further includes generating an output signal based on the plurality of phase-aligned signals via digital logic to phase-align the output signal to at least one of the sampling phases of the AC clock signal.

Another example includes an isochronous receiver system. The system includes a pulse receiver configured to receive an input data signal from a transmission line and to convert the input data signal to a single flux quantum (SFQ) pulse signal, and a converter system. The converter system includes a phase converter system comprising a plurality of pulse converters associated with a respective plurality of sampling windows across a period of an AC clock signal. At least two of the sampling windows overlap at any given phase of the AC clock signal. The pulse converters can be configured to generate reciprocal quantum logic (RQL) phase-aligned signals associated with at least two of the sampling windows. The converter system also includes a digital logic configured to generate a reciprocal quantum logic (RQL) output signal that is phase-aligned with at least one of a plurality of sampling phases of the AC clock signal based on the RQL phase signals.

BRIEF DESCRIPTION OF THE DRAWINGS

FIG. 7 illustrates an example of truth table.

DETAILED DESCRIPTION

Figure 1:
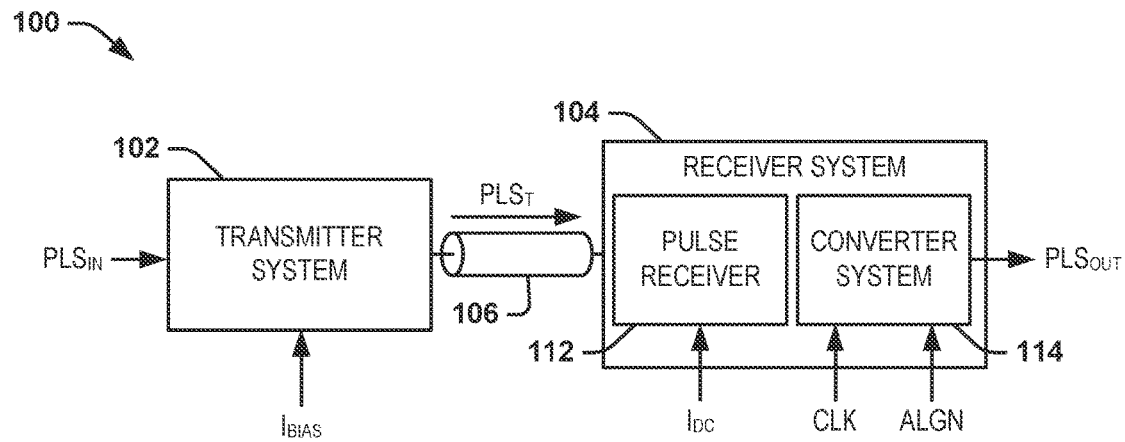
FIG. 1 illustrates an example of an isochronous superconducting inter-chip transmission system.

This disclosure relates generally to superconducting computer systems, and more specifically to a superconducting isochronous data receiver. The superconducting isochronous receiver system can be implemented in a variety of superconducting inter-chip communication systems, such as in a reciprocal quantum logic (RQL) computer system. The superconducting isochronous receiver system includes a pulse receiver configured to receive a data signal from a transmission line and to convert the data signal to a pulse signal. As an example, the data signal can be generated from a transmission system that is configured to convert an RQL input signal into an SFQ signal, and to convert the SFQ signal into the data signal that is transmitted across the transmission line.

The superconducting isochronous receiver system also includes a converter system that is configured to convert the pulse signal to a plurality of phase-aligned signals via a plurality of pulse converters. Each of the pulse converters can be associated with a sampling window, such as extending before and beyond a sampling phase of an AC clock signal and including intermediate sampling windows, such that at least two of the sampling windows overlap at any given phase of the AC clock signal. For example, the sampling windows can include first sampling windows that are associated with equidistant sampling phases of the AC clock signal (e.g., 90° increments), and can further include second sampling windows that are associated with 45° intermediate phases between the equidistant sampling phases. The second sampling windows can be less than the first sampling windows in phase length. The phase-aligned signals can thus be implemented (e.g., via a digital logic) to phase-align an output signal with at least one sampling phase of the AC clock signal (e.g., in response to an alignment signal).

As an example, the converter system can include a splitter stage that is configured to split the pulse signal into a plurality of pulse signals that are provided to the respective plurality of pulse converters. The pulse converters are provided the AC clock signal to convert the pulse signals into a plurality of phase-aligned signals (e.g., RQL phase signals), with each of the phase-aligned signals being associated with a separate respective phase of the AC clock signal (e.g., associated with sequential 90° phases of the AC clock signal). Thus, based on the respective timing of the pulse signals, an associated pulse-aligned signal can be provided based on the timing windows of the sampling phases of the AC clock signal. The phase-aligned signals can thus be provided to digital logic that is configured to generate an RQL output signal that is aligned with at least one sampling phase of the AC clock signal based on the phase-aligned signals provided in at least two of the sampling windows and in response to an alignment signal that is configured to provide a trigger. Therefore, the output signal can be aligned at a known phase of the AC clock signal to provide the respective data.

FIG. 1 illustrates an example of an isochronous superconducting inter-chip transmission system 100. The isochronous superconducting inter-chip transmission system 100 can be implemented in any of a variety of computer systems to provide inter-chip communication in a superconducting data transfer (e.g., in a reciprocal quantum logic (RQL) communication system). The isochronous superconducting inter-chip transmission system 100 can be implemented to provide the inter-chip communication in a manner that can accommodate an unknown or arbitrary phase relation between clock signals associated with transmission and reception of the communicated data.

The isochronous superconducting inter-chip transmission system 100 includes a transmitter system 102 and a receiver system 104 that are separated by a transmission line 106. The transmitter system 102 is configured to receive an input signal (e.g., an RQL input signal), demonstrated in the example of FIG. 1 as a signal $PLS_{IN}$, and to transmit the signal $PLS_{IN}$ as a pulse signal PLS corresponding to a sequence of data pulses across the transmission line 106 to the receiver system 104 based on a bias current, demonstrated as a current $I_{BIAS}$ in the example of FIG. 1. As an example, the transmitter system 102 can include a pulse converter and/or a driver that is configured to convert the input signal $PLS_{IN}$ into a pulse signal (e.g., a single flux quantum (SFQ) signal). The transmission pulse signal $PLS_T$ can correspond to a high amplitude pulse for transmission across the non-clocked transmission line 106, as opposed to the discrete pulse signal that is input to the transmitter system 102 (e.g., a superconducting pulse, such as an SFQ pulse).

The transmission pulse signal PLS is provided to the receiver system 104. The receiver system 104 includes a receiver 112 that is configured to convert the received transmission pulse signal PLS back into a pulse signal (e.g., an SFQ pulse). As an example, the receiver 112 can be configured as a JTL that provides a DC bias current, demonstrated as a current $I_{DC}$ in the example of FIG. 1. As an example, the receiver 112 thus converts the received transmission pulse signal PLS into the pulse signal based on the triggering of at least one Josephson junction in response to the transmission pulse signal $PLS_T$ and based on the current $I_{DC}$ (e.g., an under-damped Josephson junction at an input of the receiver 112 to which the transmission pulse signal PLS is provided). The pulse signal is thus provided to a converter system 114 that is configured to convert the pulse signal into an output signal $PLS_{OUT}$ based on an AC clock signal CLK and an alignment signal ALGN that can initiate alignment of the output signal $PLS_{OUT}$ to a sampling phase of the AC clock signal CLK, as described in greater detail herein. For example, the output signal $PLS_{OUT}$ can be provided as an RQL output signal.

As an example, the converter system 114 can be configured to split the pulse signal into a plurality of pulse signals, with each of the pulse signals being provided to a respective plurality of pulse converters that are configured to convert the pulse signals into a plurality of phase-aligned signals based on phases of the AC clock signal CLK. As described herein, each of the pulse converters can be associated with a separate respective sampling window across a period of the AC clock signal CLK. As described herein, the term "sampling window" describes a range of phases of the AC clock signal CLK in which a pulse signal input to a respective one of the pulse converters will result in the respective pulse converter providing a phase-aligned signal as an output. The sampling windows can each have a defined phase length, such as one of a first phase length for the sampling windows associated with equidistant sampling phases of the AC clock signal CLK and a second phase length for the sampling windows associated with intermediate phases (e.g., 45° phase-shifted) of the AC clock signal CLK. For example, the second sampling window can have a phase length that is shorter than the first sampling window. Based on the respective phase lengths of the sampling windows, at least two of the sampling windows can overlap at any given phase of the AC clock signal CLK. Therefore, the pulse converters can provide at least two phase-aligned signals in response to the pulse signal.

As described herein, the term "sampling phase" refers to a phase of the AC clock signal CLK that data (e.g., RQL data) is sampled in each period of the AC clock signal CLK. For example, the sampling phases of the AC clock signal CLK can correspond to 0°, 90°, 180°, and 270°. As also described herein, the term "intermediate phase" refers to a phase that is between a set of two sampling phases (e.g., by 45°). For example, the intermediate phases of the AC clock signal CLK can correspond to 45°, 135°, 225°, and 315°. As described herein, the AC clock signal CLK can sample the pulse signals via respective pulse converters at each of the sampling phases and each of the intermediate phases to generate the respective phase-aligned signals.

The phase-aligned signals can be provided to a digital logic associated with the converter system 114. The digital logic can perform a logic operation between the at least two phase-aligned signals and at least one phase-aligned signal associated with the sampling phases of the AC clock signal CLK. Based on the logic operation and in response to the alignment signal ALGN, the converter system 114 can thus provide the output signal PLS OUT aligned to at least one of the sampling phases of the AC clock signal CLK. Therefore, the output signal $PLS_{OUT}$ can be aligned at one or more known phases of the AC clock signal CLK. As a result, the receiver system 104 can accommodate an unknown and/or arbitrary phase relationship between a clock signal associated with the input signal $PLS_{IN}$ and the output signal $PLS_{OUT}$, such as based on time varying skew in an associated clock distribution circuit, dynamic changes in loading on the clock, and/or thermal noise.

Figure 2:
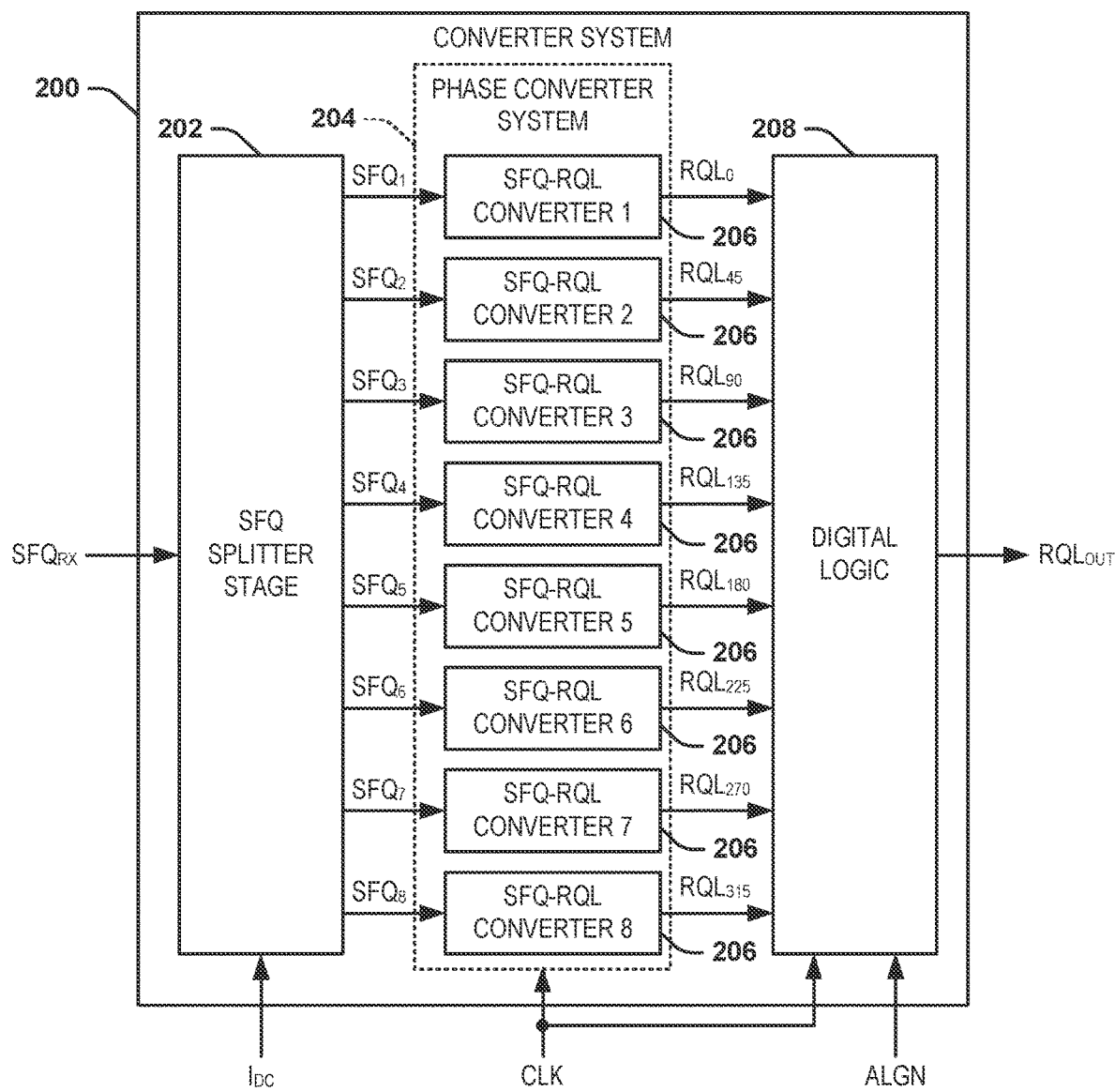
FIG. 2 illustrates an example of a converter system.

FIG. 2 illustrates an example of a converter system 200. The converter system 200 can correspond to the converter system 114 in the example of FIG. 2, and can thus be configured to convert a pulse signal, demonstrated as an SFQ pulse signal $SFQ_{RX}$, such as associated with the transmission pulse signal PLS received from the transmission line 106, into an output signal, demonstrated as an RQL output signal $RQL_{OUT}$.

The converter system 200 includes an SFQ splitter stage 202 that is configured to split the SFQ signal $SFQ_{RX}$ into a plurality of SFQ signals, demonstrated in the example of FIG. 2 as $SFQ_1$, $SFQ_2$, $SFQ_3$, $SFQ_4$, $SFQ_5$, $SFQ_6$, $SFQ_7$, and $SFQ_8$. The number of SFQ signals, eight in the example of FIG. 2, can correspond to 45° phase intervals of the AC clock signal CLK. For example, the AC clock signal CLK can be a quadrature clock signal that includes an in-phase component and a quadrature-phase component that are out-of-phase by 90°, and thus provide four separate equidistant sample times at each 90° increment of a given period. The SFQ signals $SFQ_1$, $SFQ_2$, $SFQ_3$, $SFQ_4$, $SFQ_5$, $SFQ_6$, $SFQ_7$, and $SFQ_8$ can thus be associated with the equidistant sampling phases and intermediate phases (e.g., 45° from the sampling phases) of the AC clock signal CLK.

Each of the SFQ signals $SFQ_1$, $SFQ_2$, $SFQ_3$, $SFQ_4$, $SFQ_5$, $SFQ_6$, $SFQ_7$, and $SFQ_8$ is provided to a phase converter system 204. In the example of FIG. 2, the phase converter system 204 includes a plurality of SFQ-RQL pulse converters 206 that each receive a respective one of the SFQ signals $SFQ_1$, $SFQ_2$, $SFQ_3$, $SFQ_4$, $SFQ_5$, $SFQ_6$, $SFQ_7$, and $SFQ_8$. Each of the SFQ-RQL pulse converters 206 can be associated with a separate respective sampling window across a period of the AC clock signal CLK. The sampling window of each of the SFQ-RQL pulse converters 206 can have a defined phase length that extends before and beyond a respective one of the sampling phases or intermediate phases of the AC clock signal CLK. The sampling windows can have phase lengths that vary between the sampling windows associated with the sampling phases of the AC clock signal CLK and the intermediate phases of the AC clock signal CLK. For example, first sampling windows associated with the sampling phases of the AC clock signal CLK can have a phase length (e.g., greater than 120°) that is longer than second sampling windows associated with the intermediate phases of the AC clock signal CLK (e.g., approximately 90°). Based on the respective phase lengths of the sampling windows, at least two of the sampling windows can overlap at any given phase of the AC clock signal CLK.

Figure 3:
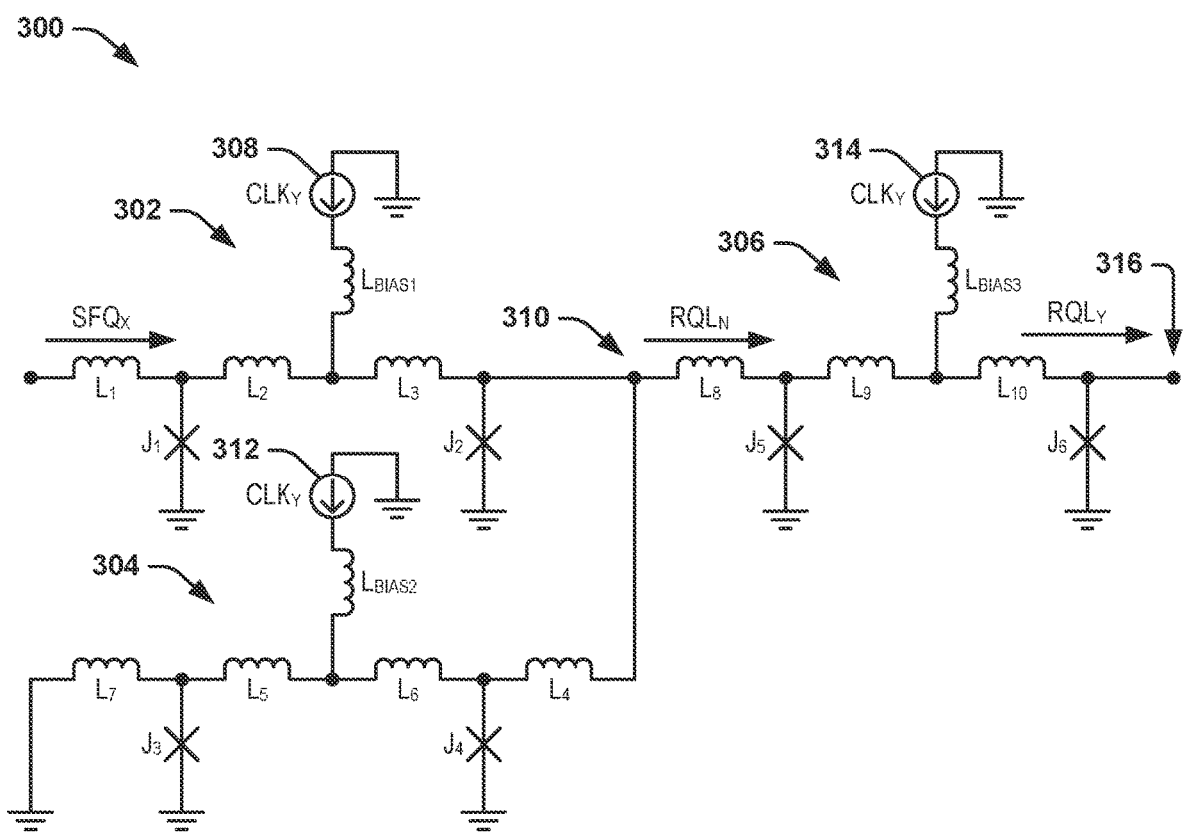
FIG. 3 illustrates an example of an SFQ-RQL pulse converter.

FIG. 3 illustrates an example of an SFQ-RQL pulse converter 300. The SFQ-RQL pulse converter 300 can correspond to any one of the SFQ-RQL pulse converters 206 in the example of FIG. 2, and can thus be configured to generate an RQL phase-aligned signal that either has a fluxon/anti-fluxon pair or not depending on a relative timing between the arrival of an input SFQ signal $SFQ_N$ corresponding to a respective one of the SFQ signals $SFQ_1$, $SFQ_2$, $SFQ_3$, $SFQ_4$, $SFQ_5$, $SFQ_6$, $SFQ_7$, and $SFQ_8$ and the respective sampling and intermediate phases of the AC clock signal CLK (e.g., 0°, 45°, 90°, 135°, 180°, 225°, 270°, and 315°, respectively).

The SFQ-RQL pulse converter 300 includes a first input JTL stage 302 and a second input JTL stage 304. The first input JTL stage 302 is configured to receive the input SFQ pulse $SFQ_N$ and propagate the input SFQ pulse $SFQ_N$ to an output JTL stage 306. The first input JTL stage 302 includes an input inductor $L_1$ through which the SFQ pulse $SFQ_N$ propagates and a first Josephson junction $J_1$ that is triggered in response to the SFQ pulse $SFQ_N$ based on a DC bias signal $I_{DC}$ generated via a current source 308. The current $I_{DC}$ flows through a first bias inductor $L_{BIAS1}$ to bias the first Josephson junction $J_1$ and a second Josephson junction $J_2$ via respective inductors $L_2$ and $L_3$, such that the SFQ pulse $SFQ_N$ propagates through the inductors $L_2$ and $L_3$ in response to the first Josephson junction $J_1$ triggering, to subsequently trigger the Josephson junction $J_2$ to provide the SFQ pulse $SFQ_N$ to the output driver stage 306 via a node 310.

The second input JTL stage 304 is coupled to the node 310 via an inductor $L_4$ and is configured substantially similarly with respect to the first input JTL stage 302. Particularly, the second input JTL stage 304 includes a pair of Josephson junctions $J_3$ and $J_4$ that are arranged opposite each other with respect to a DC bias current $I_{DC}$ generated via a current source 312 (e.g., from the same current source 308) through a second bias inductor $L_{BIAS2}$ and through inductors $L_5$ and $L_6$. However, the second input JTL stage 304 also includes an inductor $L_7$ that is coupled to ground, such that the second input JTL stage 304 generates an anti-fluxon in response to the fluxon corresponding to the SFQ pulse $SFQ_N$. Therefore, in response to the SFQ pulse $SFQ_N$ being provided at the first input JTL stage 302, the second input JTL stage 304 generates a corresponding anti-fluxon to provide an RQL signal $RQL_N$ at the output JTL stage 306.

The output JTL stage 306 is arranged substantially similar to the first and second input JTL stages 302 and 304. The output JTL stage 306 includes an input inductor $L_8$ through which the RQL signal $RQL_N$ propagates, as well as a pair of Josephson junctions $J_5$ and $J_6$ that are arranged opposite each other with respect to a bias current source 314 and respective inductors $L_9$ and $L_{10}$. However, the bias current source 314 is configured as an AC current source that is associated with a particular respective sampling phase associated with the AC clock signal CLK. In the example of FIG. 3, the AC current is demonstrated as a signal $CLK_Y$ that is provided through a bias inductor $L_{BIAS3}$, where Y corresponds to a given one of the sampling and intermediate phases of the AC clock signal CLK (e.g., 0°, 45°, 90°, 135°, 180°, 225°, 270°, and 315°, respectively). Therefore, if the RQL signal $RQL_N$ arrives in approximately time alignment with the respective phase of the AC clock signal $CLK_Y$ (e.g., based on providing magnetic energy in the inductors $L_8$ and $L_9$), the RQL signal $RQL_N$ will be propagated to an output 316 of the output JTL stage 306 as an RQL output signal $RQL_Y$ via triggering of the Josephson junctions $J_5$ and $J_6$, where Y corresponds to the respective phase of the AC clock signal $CLK_Y$. However, if the arrival of the RQL signal $RQL_N$ is misaligned with respect to the phase of the AC clock signal $CLK_Y$, the RQL signal $RQL_N$ will be reflected from the output 316 of the output JTL stage 306. As a result, no RQL pulse will be provided from the output 316 of the output JTL stage 306 (e.g., the RQL signal RQLY will be zero volts).

As an example, the circuit components of the first input JTL stage 302 can be tuned to define the sampling window associated with the respective SFQ-RQL pulse converter 300. Such tuning can affect both the phase of the SFQ-RQL pulse converter 300 with respect to the AC clock signal CVLK and the phase length of the associated sampling window. For example, for a first sampling window associated with the sampling phases of the AC clock signal CLK (e.g., 0°, 90°, 180°, and 270°), the Josephson junctions $J_1$ through $J_4$ can be fabricated to have critical current amplitudes of less than or equal to approximately 50 µA, and the input inductor $L_1$ can have an inductance that is less than approximately 12 pH. As an example, the Josephson junctions $J_1$, $J_3$, and $J_4$ can have critical current amplitudes of approximately 35 µA, the Josephson junction $J_2$ can have a critical current amplitude of approximately 50 µA, and the input inductor can have an inductance of approximately of approximately 10.24 pH. Similarly, for a second sampling window associated with the sampling phases of the AC clock signal CLK (e.g., 45°, 135°, 225°, and 315°), the Josephson junctions $J_1$ through $J_4$ can be fabricated to have critical current amplitudes that are greater than (e.g., approximately double) the Josephson junctions $J_1$ through $J_4$ of the first sampling window, and the input inductor $L_1$ can have an inductance that is greater than approximately the input inductor $L_1$ of the first sampling window. As an example, the Josephson junctions $J_1$, $J_3$, and $J_4$ can have critical current amplitudes of approximately 70 μA, the Josephson junction $J_2$ can have a critical current amplitude of approximately 100 μA, and the input inductor can have an inductance of approximately of approximately 16.64 pH. Accordingly, the SFQ-RQL pulse converter 300 can be fabricated approximately the same with respect to the arrangement of circuit components, with the characteristics of the circuit components defining the first and second sampling windows associated with the sampling or intermediate phases of the AC clock signal CLK.

Referring back to the example of FIG. 2, the first of the SFQ-RQL pulse converters 206 can be associated with the 0° sampling phase of the period of the AC clock signal CLK, and the second of the SFQ-RQL pulse converters 206 can be associated with the 45° intermediate phase of the period of the AC clock signal CLK. Similarly, the third of the SFQ-RQL pulse converters 206 can be associated with the 90° sampling phase of the period of the AC clock signal CLK, and the fourth of the SFQ-RQL pulse converters 206 can be associated with the 135° intermediate phase of the period of the AC clock signal CLK. Similarly, the fifth of the SFQ-RQL pulse converters 206 can be associated with the 180° sampling phase of the period of the AC clock signal CLK, and the sixth of the SFQ-RQL pulse converters 206 can be associated with the 225° intermediate phase of the period of the AC clock signal CLK. Similarly, the seventh of the SFQ-RQL pulse converters 206 can be associated with the 270° sampling phase of the period of the AC clock signal CLK, and the eighth of the SFQ-RQL pulse converters 206 can be associated with the 315° intermediate phase of the period of the AC clock signal CLK.

As described previously, the SFQ-RQL pulse converters 206 can each have a sampling window that extends in phase before and beyond the respective one of the sampling phase or intermediate phase of the respective one of the SFQ-RQL pulse converters 206. Therefore, each of the SFQ-RQL pulse converters 206 is configured to generate an RQL phase-aligned signal, demonstrated in the example of FIG. 2 as $RQL_0$, $RQL_{45}$, $RQL_{90}$, $RQL_{135}$, $RQL_{180}$, $RQL_{225}$, $RQL_{270}$, and $RQL_3$ is respectively, in response to the respective SFQ pulse SFQX being input to the respective SFQ-RQL pulse converter 206 at a phase of the AC clock signal CLK that is within the sampling window of the respective the SFQ-RQL pulse converters 206. Thus, each of the RQL phase-aligned signals $RQL_0$, $RQL_{45}$, $RQL_{90}$, $RQL_{135}$, $RQL_{180}$, $RQL_{225}$, $RQL_{270}$, and $RQL_{315}$ can either include an associated fluxon (e.g., and subsequent anti-fluxon) or not, depending on the timing of the arrival of the respective SFQ signals $SFQ_1$, $SFQ_2$, $SFQ_3$, $SFQ_4$, $SFQ_5$, $SFQ_6$, $SFQ_7$, and $SFQ_8$ at a phase of the AC clock signal CLK within the sampling window of the respective SFQ-RQL pulse converter 206.

Figure 4:
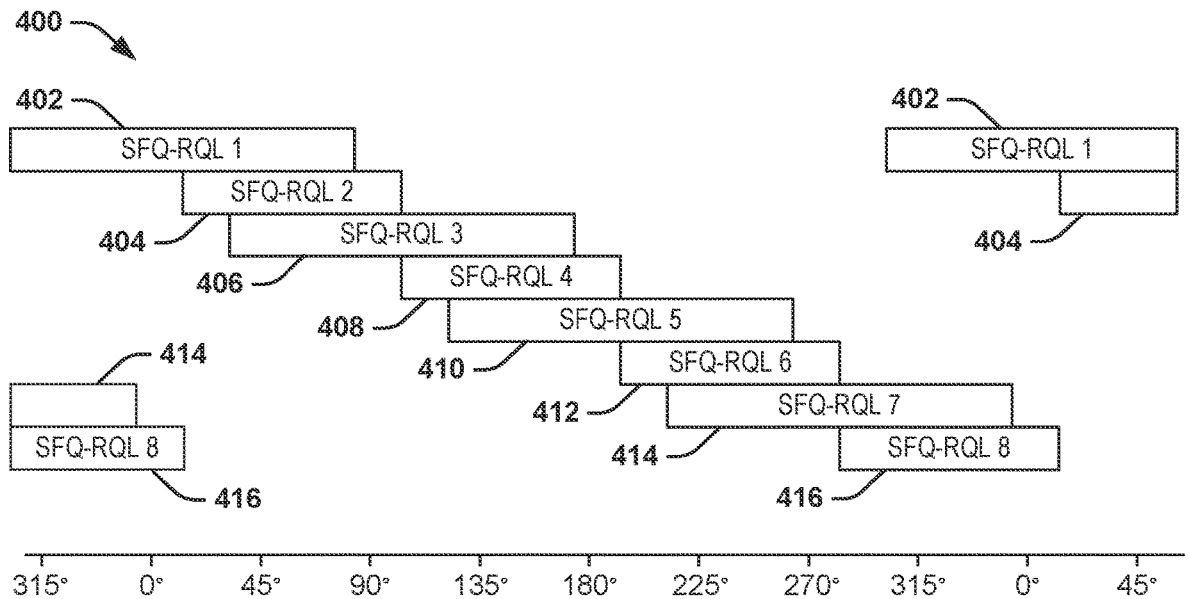
FIG. 4 illustrates an example of a phase diagram.

FIG. 4 illustrates an example of a phase diagram 400. The phase diagram 400 includes the sampling windows associated with each of the SFQ-RQL pulse converters 206 arranged relative to the phase of the AC clock signal CLK. Therefore, reference is to be made to the example of FIG. 2 in the following description of the example of FIG. 4.

The phase diagram 400 includes a first sampling window 402 that is associated with the phase-aligned signal $RQL_0$, a second sampling window 404 that is associated with the phase-aligned signal $RQL_{45}$, a third sampling window 406 that is associated with the phase-aligned signal $RQL_{90}$, and a fourth sampling window 408 that is associated with the phase-aligned signal $RQL_{135}$. The phase diagram 400 also includes a fifth sampling window 410 that is associated with the phase-aligned signal $RQL_{180}$, a sixth sampling window 412 that is associated with the phase-aligned signal $RQL_{225}$, a seventh sampling window 414 that is associated with the phase-aligned signal $RQL_{270}$, and an eighth sampling window 416 that is associated with the phase-aligned signal $RQL_{315}$. The phase diagram 400 also includes seventh and eight sampling windows 414 and 416 associated with a previous period of the AC clock signal CLK, as well as first and second sampling windows 402 and 404 associated with a next period of the AC clock signal CLK.

In the example of FIG. 4, each of the sampling windows 402, 404, 406, 408, 410, 412, 414, and 416 encapsulates and extends before and beyond the phase angle of the AC clock signal CLK of the respective one of the phase-aligned signals RQL with which it is associated. The first sampling window 402 has a first phase length that encapsulates 0° and extends from approximately 300° (in the previous period) to approximately 84°, and therefore extends approximately 144°. The second sampling window 402 has a second phase length that encapsulates 45° and extends from approximately 20° to approximately 110°, and therefore extends approximately 90°. The third sampling window 406 has the first phase length that encapsulates 90° and extends approximately 144°. The fourth sampling window 408 has the second phase length that encapsulates 135° and extends approximately 90°. The fifth sampling window 410 has the first phase length that encapsulates 180° and extends approximately 144°. The sixth sampling window 412 has the second phase length that encapsulates 225° and extends approximately 90°. The seventh sampling window 414 has the first phase length that encapsulates 270° and extends approximately 144°. The eighth sampling window 416 has the second phase length that encapsulates 315° and extends approximately 90°.

The phase diagram 400 therefore demonstrates that, at any given phase of the AC clock signal CLK, at least two of the sampling windows 402, 404, 406, 408, 410, 412, 414, and 416 overlap. As a result, for any given SFQ pulse that is provided to the phase converter system 204, at least two of the SFQ-RQL pulse converters 206 will generate respective RQL phase-aligned signals.

Referring back to the example of FIG. 2, the RQL phase-aligned signals $RQL_0$, $RQL_{45}$, $RQL_{90}$, $RQL_{135}$, $RQL_{180}$, $RQL_{225}$, $RQL_{270}$, and $RQL_{315}$ are provided to digital logic 208 that is configured to align the RQL pulse associated with the one or more of the RQL phase-aligned signals $RQL_0$, $RQL_{45}$, $RQL_{90}$, $RQL_{135}$, $RQL_{180}$, $RQL_{225}$, $RQL_{270}$, and $RQL_{315}$ to at least one predetermined sampling phase of the RQL clock signal CLK to generate the RQL output signal $RQL_{OUT}$. As explained in greater detail herein, the digital logic 208 is configured to generate enable signals based on the at least two phase-aligned signals and in response to the alignment signal ALGN to provide a logic operation between the enable signals and the phase-aligned signal associated with the respective sampling phase of the AC clock signal CLK to generate the RQL output signal $RQL_{OUT}$. Accordingly, the RQL output signal $RQL_{OUT}$ and subsequent RQL output signals $RQL_{OUT}$ can be phase-aligned to the AC clock signal CLK.

Figure 5:
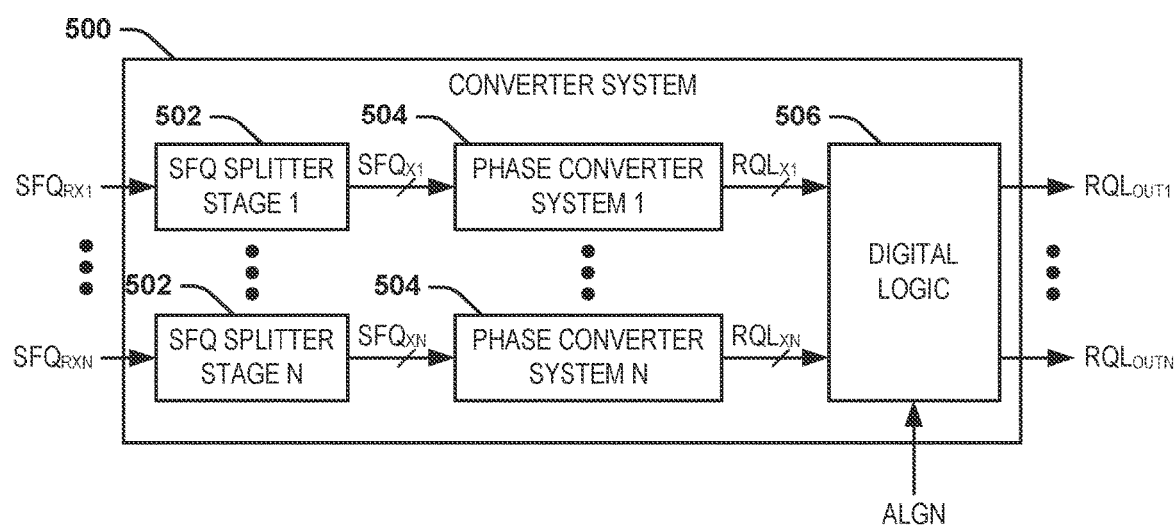
FIG. 5 illustrates another example of converter system.

FIG. 5 illustrates another example of a converter system 500. The converter system 500 can correspond to the converter system 114 in the example of FIG. 5, but can instead be implemented for a multi-bit bus. Therefore, the converter system 500 can be configured to convert a plurality N of pulse signals, demonstrated as SFQ pulse signals $SFQ_{RX1}$ through $SFQ_{RXN}$, into a plurality N of output signals, demonstrated as RQL output signals $RQL_{OUT1}$ and $RQL_{OUTN}$. The quantity N can be any integer greater than one.

The converter system 500 includes N SFQ splitter stages 502 that are each configured to split one of the SFQ signal $SFQ_{RX1}$ through $SFQ_{RXN}$ into a plurality of SFQ signal sets, demonstrated in the example of FIG. 5 as $SFQ_{X1}$ through $SFQ_{XN}$. Each of the signal sets $SFQ_{X1}$ through $SFQ_{XN}$ can correspond to the SFQ signals $SFQ_1$, $SFQ_2$, $SFQ_3$, $SFQ_4$, $SFQ_5$, $SFQ_6$, $SFQ_7$, and $SFQ_8$ in the example of FIG. 2. Therefore, the signal sets $SFQ_{X1}$ through $SFQ_{XN}$ can correspond to the equidistant sampling phases and intermediate phases of the AC clock signal CLK, similar to as described above in the example of FIG. 2.

Each of the signal sets $SFQ_{X1}$ through $SFQ_{XN}$ is provided to a respective one of N phase converter systems 504. For example, a first one of the phase converter systems 504 can include a plurality of SFQ-RQL pulse converters that each receive a respective one of the SFQ signals $SFQ_1$, $SFQ_2$, $SFQ_3$, $SFQ_4$, $SFQ_5$, $SFQ_6$, $SFQ_7$, and $SFQ_8$, similar to as described above in the example of FIG. 2. The remaining phase converter systems can include SFQ-RQL pulse converters that are associated only with the sampling phases of the AC clock signal CLK. Therefore, the SFQ-RQL pulse converters of the first of the phase converter systems 504 can be associated with a separate respective sampling window of each of the sampling phases and intermediate phases (e.g., 0°, 45°, 90°, 135°, 180°, 225°, 270°, and 315°) across a period of the AC clock signal CLK, such as demonstrated in the example of FIG. 4. The SFQ-RQL pulse converters of the remaining phase converter systems 504 can be associated with the sampling windows associated with just the sampling phases (e.g., 0°, 90°, 180°, and 270°) across a period of the AC clock signal CLK. Accordingly, for each the SFQ pulse signals $SFQ_{RX1}$, the respective first phase converter system 504 can generate at least two phase-aligned signals, demonstrated as phase-aligned signal sets $RQL_{X1}$. For each of the remaining SFQ pulse signals $SFQ_{RX2}$ through $SFQ_{RXN}$, the respective remaining phase converter systems 504 can generate at least one respective phase-aligned signal set $RQL_{X2}$ through $RQL_{XN}$.

In the example of FIG. 5, the RQL phase-aligned signal sets $RQL_{X1}$ through $RQL_{XN}$ are provided to digital logic 506 that is configured to align the RQL pulse associated with one of the RQL phase-aligned signals in each of the phase-aligned signal sets $RQL_{X1}$ through $RQL_{XN}$ to at least one predetermined sampling phase of the RQL clock signal CLK to generate respective RQL output signals $RQL_{OUT1}$ through $RQL_{OUTN}$. As an example, the digital logic 508 is configured to generate enable signals based on the at least two phase-aligned signals from the first of the phase converter systems 504 and in response to the alignment signal ALGN to provide a logic operation between the enable signals and the phase-aligned signal associated with the respective sampling phase of the AC clock signal CLK for each of the phase converter systems 504 to generate the RQL output signals $RQL_{OUT1}$ through $RQL_{OUTN}$. Accordingly, the RQL output signals $RQL_{OUT1}$ through $RQL_{OUTN}$ and subsequent RQL output signals $RQL_{OUT1}$ through $RQL_{OUTN}$ on each of the outputs from the digital logic 506 can be phase-aligned to the AC clock signal CLK.

Figure 6:
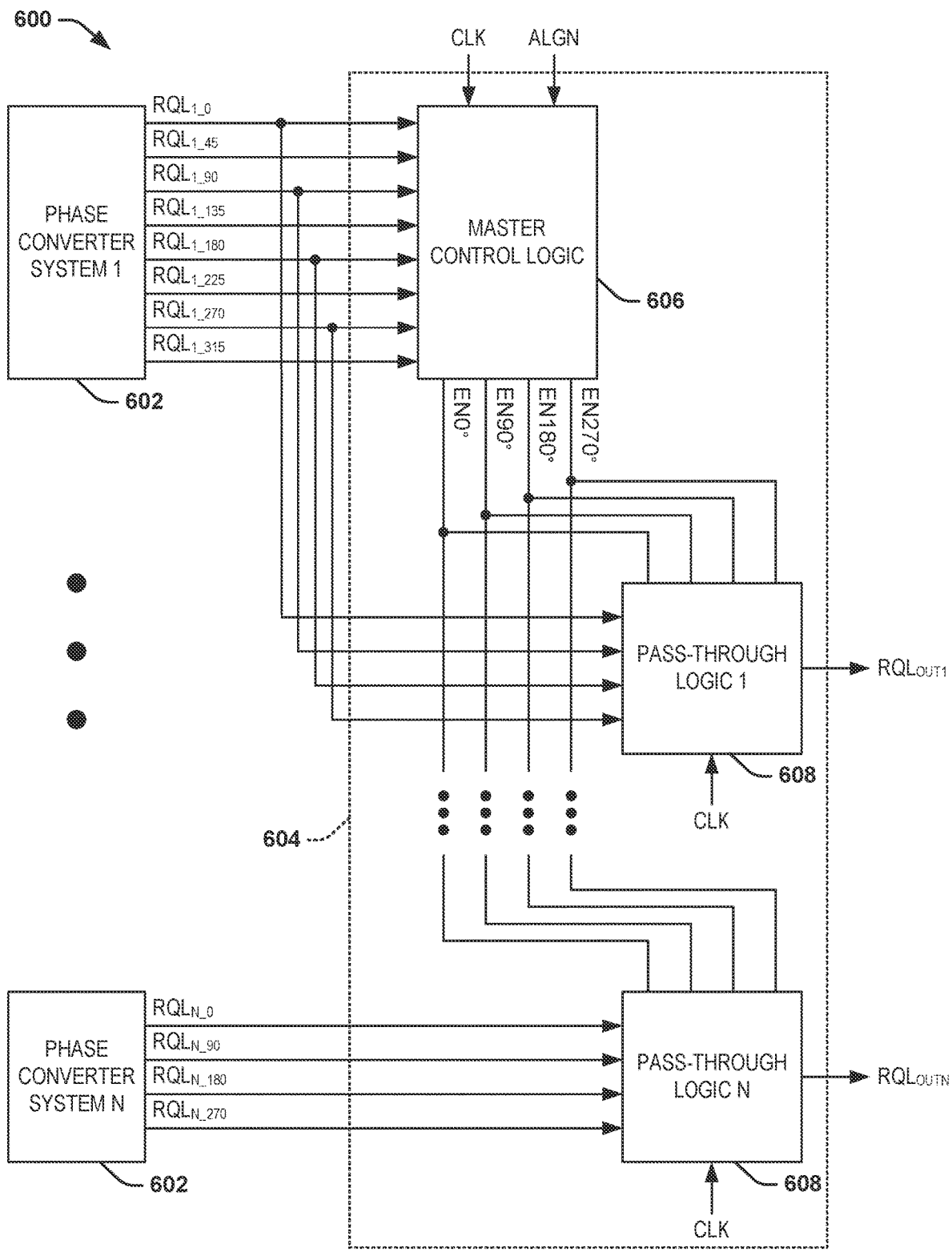
FIG. 6 illustrates yet another example of converter system.

FIG. 6 illustrates yet another example of converter system 600. The converter system 600 can correspond to a portion of the converter system 500 in the example of FIG. 6. Therefore, reference is to be made to the example of FIG. 5 in the following description of the example of FIG. 6.

The converter system 600 includes N phase converter systems 602 that can each correspond to the phase converter systems 602 in the example of FIG. 5. As an example, each of the phase converter systems 602 can include a plurality of SFQ-RQL pulse converters. For example, the first phase converter system 602 can include eight SFQ-RQL pulse converters that each receive a respective one of the SFQ signals $SFQ_1$, $SFQ_2$, $SFQ_3$, $SFQ_4$, $SFQ_5$, $SFQ_6$, $SFQ_7$, and $SFQ_8$, and therefore associated with the sampling phases and intermediate phases of the AC clock signal CLK, similar to as described above in the example of FIG. 2. Thus, in the example of FIG. 6, the first phase converter system 602 is demonstrated as providing the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ as outputs. Therefore, the SFQ-RQL pulse converters of the first of the phase converter systems 602 can be associated with a separate respective sampling window of each of the sampling phases and intermediate phases (e.g., 0°, 45°, 90°, 135°, 180°, 225°, 270°, and 315°) across a period of the AC clock signal CLK, such as demonstrated in the example of FIG. 4.

The remaining phase converter systems 602 can include four SFQ-RQL pulse converters that are associated only with the sampling phases of the AC clock signal CLK. Thus, in the example of FIG. 6, the remaining phase converter systems 602 provide phase-aligned signals $RQL_{X\_0}$, $RQL_{X\_90}$, $RQL_{X\_180}$, and $RQL_{X\_270}$ as outputs, where X is an index number of the respective one of the phase converter systems 602, with the Nth phase converter system 602 being demonstrated in the example of FIG. 6. Therefore, the SFQ-RQL pulse converters of the remaining phase converter systems 602 can be associated with the sampling windows associated with just the sampling phases (e.g., 0°, 90°, 180°, and 270°) across a period of the AC clock signal CLK. Accordingly, the first phase converter system 602 can generate at least two of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ for any given SFQ input signal $SFQ_1$, and the remaining phase converter systems 602 can generate at least one of the phase-aligned signals $RQL_{X\_0}$, $RQL_{X\_90}$, $RQL_{X\_180}$, and $RQL_{X\_270}$ for any given SFQ input signal $SFQ_X$.

In the example of FIG. 6, the RQL phase-aligned signal sets $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ and $RQL_{X\_0}$, $RQL_{X\_90}$, $RQL_{X\_180}$, and $RQL_{X\_270}$ are provided to digital logic 604. Digital logic 604 includes a master control logic 606 and a plurality N of pass-through logics 608. Each of the pass-through logics 608 is associated with a respective one of the phase converter systems 602 and are each configured to generate a respective one of the plurality N of RQL output signals $RQL_{OUT1}$ through $RQL_{OUTN}$. As described herein, the pass-through logics 608 generate the respective RQL output signals $RQL_{OUT1}$ through $RQL_{OUTN}$ based on the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ provided to the master control logic 606.

In the example of FIG. 6, an alignment signal ALGN is provided to the master control logic 606. The alignment signal ALGN can be asserted to initiate alignment of the SFQ pulses $SFQ_X$ that are input to the converter system 600 (e.g., the converter system 500) and subsequent SFQ pulses on each transmission line of the associated bus to the sampling phases of the AC clock signal CLK. As described previously, the first phase converter system 602 can generate at least two of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ for any given SFQ input signal $SFQ_1$. The at least two of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ are provided to the master control logic 606. In response to the alignment signal ALGN being asserted, the master control logic 606 can identify the next received at least two of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ to provide generation of an associated RQL output signal $RQL_{OUT1}$ that is phase-aligned to at least one sampling phase of the AC clock signal CLK, and therefore phase-alignment of each concurrent RQL output signal $RQL_{OUTX}$ and each RQL output signal $RQL_{OUTX}$ associated with subsequently received SFQ pulses $SFQ_X$.

As an example, in response to receiving the at least two of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$ after assertion of the alignment signal ALGN, the master control logic 606 can consult a predefined truth table that dictates assertion of enable signals based on the at least two of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$. In the example of FIG. 6, the enable signals are demonstrated as EN0°, EN90°, EN180°, and EN270°, and are therefore associated with the sampling phases of the AC clock signal CLK. The enable signals EN0°, EN90°, EN180°, and EN270° are provided to each of the pass-through logics 608, such that the asserted enable signals EN0°, EN90°, EN180°, and EN270° are applicable to all of the pass-through logics 608 in the digital logic 604.

FIG. 7 illustrates an example of truth table 700. The truth table 700 can be stored in a memory in the digital logic 600 (e.g., in the master control logic 606). Therefore, reference is to be made to the example of FIG. 6 in the following description of the example of FIG. 7.

The truth table 700 includes entries corresponding to the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$, demonstrated generally at 702. The entries 702 therefore represent the presence of or absence of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$, as received by the master control logic 606. The truth table also includes results that demonstrate which of the enable signals EN0°, EN90°, EN180°, and EN270° are enabled in response to the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$. Therefore, in response to receiving any set of at least two of the phase-aligned signals $RQL_{1\_0}$, $RQL_{1\_45}$, $RQL_{1\_90}$, $RQL_{1\_135}$, $RQL_{1\_180}$, $RQL_{1\_225}$, $RQL_{1\_270}$, and $RQL_{1\_315}$, the master control logic 606 can enable a corresponding two of the enable signals EN0°, EN90°, EN180°, and EN270°.

Referring back to the example of FIG. 6, each of the pass-through logics 608 receives at least one phase-aligned signal $RQL_{X\_0}$, $RQL_{X\_90}$, $RQL_{X\_180}$, and $RQL_{X\_270}$ from the respective one of the phase converter systems 602. Therefore, in response to receiving the at least one phase-aligned signal $RQL_{X\_0}$, $RQL_{X\_90}$, $RQL_{X\_180}$, and $RQL_{X\_270}$ and the asserted enable signals EN0°, EN90°, EN180°, and EN270°, each of the pass-through logics 608 is configured to implement a logic operation to generate the respective one of the RQL output signals $RQL_{OUT1}$ through $RQL_{OUTN}$, with the respective one of the RQL output signals $RQL_{OUT1}$ through $RQL_{OUTN}$ being aligned to at least one respective phase of the AC clock signal CLK. For example, each of the pass-through logics 608 is configured to implement a logic-AND operation on the at least one phase-aligned signal $RQL_{X\_0}$, $RQL_{X\_90}$, $RQL_{X\_180}$, and $RQL_{X\_270}$ and the asserted enable signals EN0°, EN90°, EN180°, and EN270° to either generate or not generate a respective the one of the RQL output signals $RQL_{OUT1}$ through $RQL_{OUTN}$ at each given sampling phase of the AC clock signal CLK.

As a result, the digital logic 604 can associate each of the SFQ pulses $SFQ_X$ that is input to the converter system 600 with a given sampling phase of the AC clock signal CLK. Accordingly, the receiver system described herein can accommodate an unknown and/or arbitrary phase relationship between a clock signal associated with an RQL input signal $RQL_{IN}$ and an RQL output signal $RQL_{OUT}$, such as based on time varying skew in an associated clock distribution circuit, dynamic changes in loading on the clock, and/or thermal noise. The digital logic 604 can also reject spurious SFQ pulses such as associated with other phases outside of the current sampling phase of the AC clock signal CLK (e.g., based on the logic operation of the pass-through logics 608). For example, AC clock phase drift over a long period of time can be a concern for isochronous communication links. However, based on the overlapping sampling windows provided by the pulse converters, as described herein, the total receive window can be greatly increased relative to typical isochronous receiver systems (e.g., by approximately 60% over typical isochronous receiver systems that do not implement the intermediate phase windows). Accordingly, automatic phase drift detection and re-calibration, which can be costly in terms of circuit complexity, size, and power consumption for typical isochronous receiver systems, is substantially unnecessary for the of the receiver system described herein (e.g., the receiver system 104).

Figure 8:
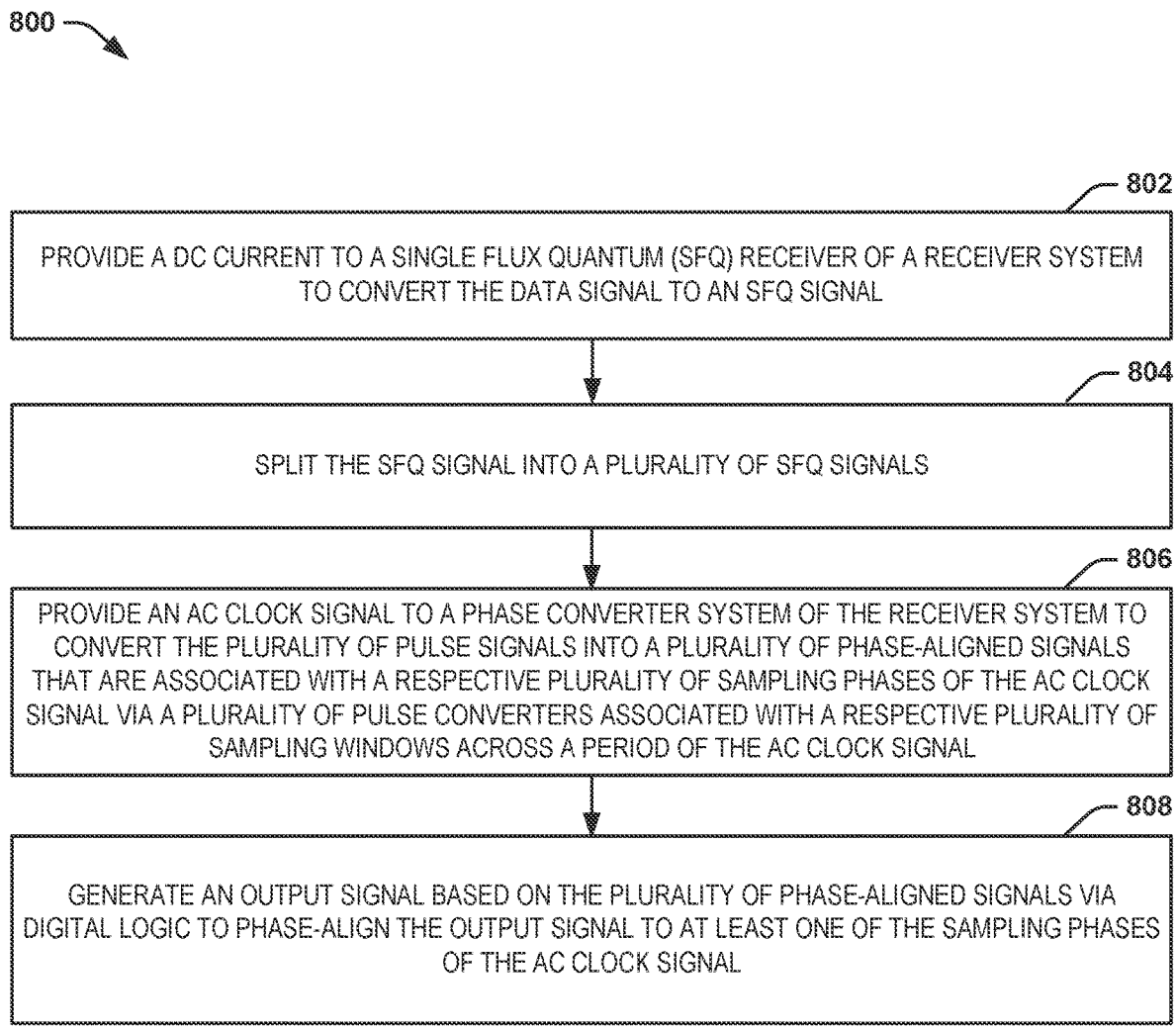
FIG. 8 illustrates an example of a method for isochronously receiving a data signal from a transmission line.

In view of the foregoing structural and functional features described above, a method in accordance with various aspects of the present disclosure will be better appreciated with reference to FIG. 8. While, for purposes of simplicity of explanation, the method of FIG. 8 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure.

FIG. 8 illustrates a method 800 for isochronously receiving a data signal (e.g., the pulse signal PLS) from a transmission line (e.g., the transmission line 16). At 802, a DC current (e.g., the DC current $I_{DC}$) is provided to a pulse receiver (e.g., the pulse receiver 112) of a receiver system (e.g., the receiver system 104) to convert the data signal to a pulse signal (e.g., the pulse signal $SFQ_{RX}$). At 804, the pulse signal is split into a plurality of pulse signals (e.g., the pulse signals $SFQ_1$, $SFQ_2$, $SFQ_3$, $SFQ_4$, $SFQ_5$, $SFQ_6$, $SFQ_7$, and $SFQ_8$). At 806, an AC clock signal (e.g., the AC clock signal CLK) is provided to a phase converter system (e.g., the phase converter system 304) of the receiver system to convert the plurality of pulse signals into a plurality of phase-aligned signals (e.g., the phase-aligned signals $RQL_0$, $RQL_{45}$, $RQL_{90}$, $RQL_{135}$, $RQL_{180}$, $RQL_{225}$, $RQL_{270}$, and $RQL_{315}$) that are associated with a respective plurality of sampling phases of the AC clock signal via a plurality of pulse converters associated with a respective plurality of sampling windows (e.g., the sampling windows 402, 404, 406, 408, 410, 412, 414, and 416) across a period of the AC clock signal. At least two of the sampling windows overlap at any given phase of the AC clock signal. At 808, an output signal (e.g., the output signal $RQL_{OUT}$) is generated based on the plurality of phase-aligned signals via digital logic (e.g., the digital logic 308) to phase-align the output signal to at least one of the sampling phases of the AC clock signal.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. An isochronous receiver system comprising:
a pulse receiver configured to receive an input data signal from a transmission line and to convert the input data signal to a pulse signal; and
a converter system comprising a phase converter system, the phase converter system comprising a plurality of pulse converters associated with a respective plurality of sampling windows across a period of an AC clock signal, at least two of the sampling windows overlapping at any given phase of the AC clock signal, such that the converter system is configured to generate an output pulse signal that is phase-aligned with at least one of the sampling phases of the AC clock signal based on associating the pulse signal with at least two of the sampling windows.

2. The system of claim 1, wherein the AC clock signal is a quadrature clock signal comprising four equidistant sampling phases, wherein the pulse converters comprise:
a first set of pulse converters associated with each of the four equidistant sampling phases of the AC clock signal; and
a second set of pulse converters associated with four intermediate phases of the AC clock signal that are 45° between the respective four equidistant sampling phases of the AC clock signal.

3. The system of claim 2, wherein the first set of pulse converters each have a first sampling window that has a phase range that extends before and beyond a respective one of the four equidistant sampling phases of the AC clock signal, wherein the second set of pulse converters each have a second sampling window that extends before and beyond a respective one of the four intermediate phases of the AC clock signal, wherein the second sampling window is smaller than the first sampling window.

4. The system of claim 3, wherein the first sampling window is greater than 120° in phase length, wherein the second sampling window is approximately 90° in phase length.

5. The system of claim 1, wherein the pulse receiver is configured as a single flux quantum (SFQ) receiver configured to receive the data signal from the transmission line and to convert the data signal to an SFQ signal, wherein the plurality of pulse converters are configured as a plurality of SFQ to reciprocal quantum logic (RQL) converters configured to phase-align a plurality of RQL phase signals with the at least one sampling phase of the AC clock signal based on associating each of the RQL phase signals with a respective at least two of the sampling windows via a respective at least two of the pulse converters.

6. The system of claim 5, wherein the converter system comprises:
an SFQ splitter stage configured to split the SFQ signal into a plurality of SFQ signals;
a phase converter system comprising the plurality of SFQ to RQL converters that are configured to sample the plurality of SFQ signals at each of a separate respective phase of the AC clock signal to generate the respective plurality of RQL phase signals; and
digital logic configured to generate an RQL output signal that is aligned with at least one of the sampling phases of the AC clock signal based on the plurality of RQL phase signals.

7. The system of claim 1, wherein the pulse receiver is configured to receive a plurality of input data signals concurrently via a multi-bit bus, wherein the converter system comprises:
a plurality of splitter stages that are each configured to split the pulse signal into a plurality of pulse signals;
a plurality of phase converter systems each comprising a plurality of pulse converters that are configured to sample the plurality of pulse signals at each of a separate respective phase of the AC clock signal to generate at least one phase-aligned signals associated with the respective one of the phase converter systems; and
digital logic configured to generate a respective plurality of output signals associated with the respective input data signals, each the plurality of output signals being aligned with at least one of the sampling phases of the AC clock signal based on the at least one phase-aligned signal associated with the respective one of the phase converter systems.

8. The system of claim 7, wherein the digital logic comprises:
a master control logic configured to receive a plurality of phase-aligned signals from a first one of the plurality of phase converter systems and to generate a set of enable signals based on the plurality of phase-aligned signals; and
a plurality of pass-through control logics that are each associated with a respective one of the plurality of phase converter systems, each of the pass-through control logics being configured to receive the set of enable signals and to generate the respective one of the output signals based on a logic operation between the at least one phase-aligned signal and the set of enable signals.

9. The system of claim 7, wherein the plurality of phase converter systems comprises a first phase converter system and at least one remaining phase converter system, wherein the at least one remaining phase converter system comprises a set of pulse converters associated with each of the four equidistant sampling phases of the AC clock signal, wherein the first phase converter system comprises:
a first set of pulse converters associated with each of the four equidistant sampling phases of the AC clock signal; and
a second set of pulse converters associated with four intermediate phases of the AC clock signal that are equidistant between the respective four equidistant sampling phases of the AC clock signal.

10. The system of claim 9, wherein the digital logic comprises:
a master control logic configured to receive a phase-aligned signal from at least one of the first set of pulse converters and from at least one of the second set of pulse converters and to generate a set of enable signals based on the phase-aligned signal from the at least one of the first set of pulse converters and from the at least one of the second set of pulse converters; and a plurality of pass-through control logics that are each associated with a respective one of the plurality of phase converter systems, each of the pass-through control logics being configured to receive at least one phase-aligned signal from the respective set of pulse converters, to receive the set of enable signals, and to generate the respective one of the output signals based on a logic operation between the at least one phase-aligned signal and the set of enable signals.

11. An inter-chip transmission system comprising the isochronous receiver system of claim 1, the inter-chip transmission system further comprising:
a transmitter system configured to convert an input signal into the input data signal; and
the transmission line to transmit the input data signal to the isochronous receiver system.

12. A method for isochronously receiving a data signal from a transmission line, the method comprising:
providing a DC current to a pulse receiver of a receiver system to convert the data signal to a pulse signal;
splitting the pulse signal into a plurality of pulse signals;
providing an AC clock signal to a phase converter system of the receiver system to convert the plurality of pulse signals into a plurality of phase-aligned signals that are associated with a respective plurality of sampling phases of the AC clock signal via a plurality of pulse converters associated with a respective plurality of sampling windows across a period of the AC clock signal, at least two of the sampling windows overlapping at any given phase of the AC clock signal; and
generating an output signal based on the plurality of phase-aligned signals via digital logic to phase-align the output signal to at least one of the sampling phases of the AC clock signal.

13. The method of claim 12, wherein the AC clock signal is a quadrature clock signal comprising four equidistant sampling phases, wherein the pulse converters comprise:
a first set of pulse converters associated with each of the four equidistant sampling phases of the AC clock signal, each of the first set of pulse converters having a first sampling window that has a phase range that extends before and beyond a respective one of the four equidistant sampling phases of the AC clock signal; and
a second set of pulse converters associated with four intermediate phases of the AC clock signal that are 45° between the respective four equidistant sampling phases of the AC clock signal, each of the second set of pulse converters having a second sampling window that extends before and beyond a respective one of the four intermediate phases of the AC clock signal, wherein the second sampling window is smaller than the first sampling window.

14. The method of claim 12, wherein providing the DC current comprises providing the DC current to the pulse receiver to convert the data signal to a single flux quantum (SFQ) pulse signal,
wherein providing the AC clock signal comprises providing the AC clock signal to the phase converter system to convert the plurality of SFQ pulse signals into a plurality of RQL phase signals that are associated with a respective plurality of sampling phases of the AC clock signal, and wherein generating the output signal comprises generating an RQL output signal based on the plurality of RQL phase signals via the digital logic to phase-align the RQL output signal to at least one of the sampling phases of the AC clock signal.

15. The method of claim 12, wherein providing the DC current comprises providing the DC current to a plurality of pulse receivers to convert each of a plurality of data signals to a respective plurality of pulse signals,
wherein providing the AC clock signal comprises providing the AC clock signal to each of a plurality of phase converter systems to convert the plurality of pulse signals associated with the respective one of the phase converter systems into a plurality of phase-aligned signals that are associated with a respective plurality of sampling phases of the AC clock signal, and
wherein generating the output signal comprises generating a plurality of output signals via the respective plurality of phase converter systems based on the respective plurality of phase-aligned signals via the digital logic associated with each of the phase converter systems to phase-align each of the output signals to at least one of the sampling phases of the AC clock signal.

16. The method of claim 15, further comprising:
receiving a plurality of phase-aligned signals from a first one of the plurality of phase converter systems at a master control logic;
generating a set of enable signals via the master control logic based on the plurality of phase-aligned signals;
receiving a set of enable signals and at least one phase-aligned signal at each of a plurality of pass-through control logics that are each associated with a respective one of the plurality of phase converter systems; and
generating each of the output signals based on a logic operation between the at least one phase-aligned signal and the set of enable signals via each of the pass-through control logics.

17. An isochronous receiver system comprising:
a pulse receiver configured to receive an input data signal from a transmission line and to convert the input data signal to a single flux quantum (SFQ) pulse signal; and
a converter system comprising:
a phase converter system comprising a plurality of pulse converters associated with a respective plurality of sampling windows across a period of an AC clock signal, at least two of the sampling windows overlapping at any given phase of the AC clock signal, the pulse converters being configured to generate reciprocal quantum logic (RQL) phase-aligned signals associated with at least two of the sampling windows; and
a digital logic configured to generate a reciprocal quantum logic (RQL) output signal that is phase-aligned with at least one of a plurality of sampling phases of the AC clock signal based on the RQL phase signals.

18. The system of claim 17, wherein the AC clock signal is a quadrature clock signal comprising four equidistant sampling phases, wherein the pulse converters comprise:
a first set of pulse converters associated with each of the four equidistant sampling phases of the AC clock signal; and
a second set of pulse converters associated with four intermediate phases of the AC clock signal that are 45° between the respective four equidistant sampling phases of the AC clock signal.

19. The system of claim 17, wherein the pulse receiver is configured to receive a plurality of input data signals concurrently via a multi-bit bus, wherein the converter system comprises:
- a plurality of splitter stages that are each configured to split the pulse signal into a plurality of SFQ pulse signals; and
- a plurality of phase converter systems each comprising a plurality of pulse converters that are configured to sample the plurality of SFQ pulse signals at each of a separate respective phase of the AC clock signal to generate at least one RQL phase signal associated with the respective one of the phase converter systems;
- wherein the digital logic is configured to generate a respective plurality of RQL output signals associated with the respective input data signals, each the plurality of RQL output signals being aligned with at least one of the sampling phases of the AC clock signal based on the at least one RQL phase signal associated with the respective one of the phase converter systems.

20. The system of claim 19, wherein the digital logic comprises:
- a master control logic configured to receive a plurality of RQL phase signals from a first one of the plurality of phase converter systems and to generate a set of enable signals based on the plurality of RQL phase signals associated with at least two of the sampling windows; and
- a plurality of pass-through control logics that are each associated with a respective one of the plurality of phase converter systems, each of the pass-through control logics being configured to receive the set of enable signals and to generate the respective one of the RQL output signals based on a logic operation between the at least one RQL phase signal and the set of enable signals.

* * * * *